US006934148B2

(12) United States Patent
Gorenz, Jr. et al.

(10) Patent No.: US 6,934,148 B2
(45) Date of Patent: Aug. 23, 2005

(54) ELECTRONIC CHASSIS AND HOUSING HAVING AN INTEGRATED FORCED AIR COOLING SYSTEM

(75) Inventors: Harold J. Gorenz, Jr., Lisle, IL (US); William R. Groves, Naperville, IL (US); Roger W. Ady, Chicago, IL (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 10/414,346

(22) Filed: Apr. 15, 2003

(65) Prior Publication Data

US 2004/0207981 A1 Oct. 21, 2004

(51) Int. Cl.$^7$ ............................................. G06F 1/16
(52) U.S. Cl. ..................... 361/681; 361/688; 165/80.2
(58) Field of Search ............................... 361/688–692; 165/80.2–80.3, 168–170

(56) References Cited

U.S. PATENT DOCUMENTS

| | | | |
|---|---|---|---|
| 4,717,216 A | 1/1988 | Hornak | |
| 5,216,579 A | 6/1993 | Basara et al. | |
| 5,282,114 A | 1/1994 | Stone | |
| 5,287,244 A | 2/1994 | Hileman et al. | |
| 5,505,533 A | 4/1996 | Kammersqard et al. | |
| 5,663,868 A | * 9/1997 | Stalley | 361/695 |
| 6,011,689 A | 1/2000 | Wrycraft | |
| 6,144,549 A | * 11/2000 | Moss et al. | 361/681 |
| 6,315,655 B1 | 11/2001 | McEwan et al. | |
| 6,389,499 B1 | * 5/2002 | Frank et al. | 710/300 |
| 6,525,935 B2 | * 2/2003 | Casebolt | 361/687 |

OTHER PUBLICATIONS

Faneuf et al. (US 2003/0002254 A1), "High Capacity Air–Cooling Systemfor Electronic Apparatus And Associated Method", Jan. 2, 2003.*

* cited by examiner

Primary Examiner—Yean-Hsi Chang
(74) Attorney, Agent, or Firm—Lawrence T. Cullen

(57) ABSTRACT

The invention provides a chassis for housing printed circuit boards comprising: a housing having a top, bottom, front, back, left and right side walls, and having a height, measured from the bottom wall to the top wall, that is equal to a 1 rack-unit. The front wall includes an inlet vent, a display module, and a jack and the back side wall includes an exhaust vent. A front wall face plate overlies the inlet vent, display module and jack, with the inlet vent arranged in parallel, overlapping but offset planes. A centrifugal blower is provided inside the chassis housing.

18 Claims, 4 Drawing Sheets

ELECTRONIC CHASSIS AND HOUSING HAVING AN INTEGRATED FORCED AIR COOLING SYSTEM

BACKGROUND OF THE INVENTION

The present invention relates generally to rack-mounted electronics chassis systems and, more particularly, to a chassis and housing having an integrated forced air cooling system that preserves the front panel and display appearance generally associated with a rack-mounted electronics chassis system.

There exists a trend toward a more compact chassis for a cable modem termination system (CMTS). The reduction in the overall size of the chassis causes two distinct problems. One, a reduction in the size of the chassis requires a corresponding reduction in the size of the front panel and display module. Most chassis manufacturers use variations of material finish (i.e. paint), printed logos, labels, etc. on the front panel to differentiate their products. In addition to reducing the front panel billboard space, the reduction reduced the available space for logos, labels, I/O connectors, user displays, user controls, and cooling vents. Accordingly, there exists a need for a reduced size front panel that is equally function and display oriented. Two, the reduced size is an obstacle to maintaining the internal circuitry at a suitable operating temperature. The internal circuitry is electrically driven and generates substantial amounts of heat energy. Larger chassis systems are able to maintain the desired operating temperature by having more space for fans and vents located on the exterior walls. However, a reduction in the size creates an associated reduction in room for such airflow features.

Chassis cooling systems in the prior art that provide for front-to-back cooling typically feature 40 mm axial fans that do not have the strength or capacity to pull and/or push air through the high static pressure for a 1 rack-unit (herein after "1U") chassis. Existing chassis designs have placed the axial fans adjacent to the front or rear panels which is not feasible for a 1U chassis that requires substantial area for I/O connectors, user interface, and various other components.

The prior art also discloses cooling systems for conventionally-sized chassis (e.g. 2U or larger) with centrally located blowers designed to create a low pressure on one side of an internal wall, and high pressure on the other side to achieve front-to-back cooling. However, the prior art centrally located blowers do not direct the path of air intake or divide the airflow exiting the blower.

BRIEF DESCRIPTION OF THE DRAWING(S)

The present invention will hereinafter be described in conjunction with the appended drawing figures wherein like numerals denote like elements.

SUMMARY OF THE INVENTION

The invention provides a chassis for housing printed circuit boards comprising: a housing having a top, bottom, front, back, left and right side walls, and having a height, measured from the bottom wall to the top wall, that is equal to a 1 rack-unit. The front wall includes an inlet vent, a display module, and a jack and the back side wall includes an exhaust vent. A centrifugal blower is provided inside the chassis housing to establish the air flow pattern. A front wall face plate overlies the inlet vent, display module and jack, respectively so the inlet vent are arranged in parallel, overlapping but offset planes.

DETAILED DESCRIPTION OF THE PREFERRED EMBODIMENT(S)

The ensuing detailed description provides preferred exemplary embodiments only, and is not intended to limit the scope, applicability, or configuration of this invention. Rather, the ensuing detailed description of the preferred exemplary embodiments will provide those skilled in the art with an enabling description for implementing the invention. It being understood that various changes may be made in the function and arrangement of elements without departing from the spirit and scope of the invention as set forth in the appended claims.

Figure 1:
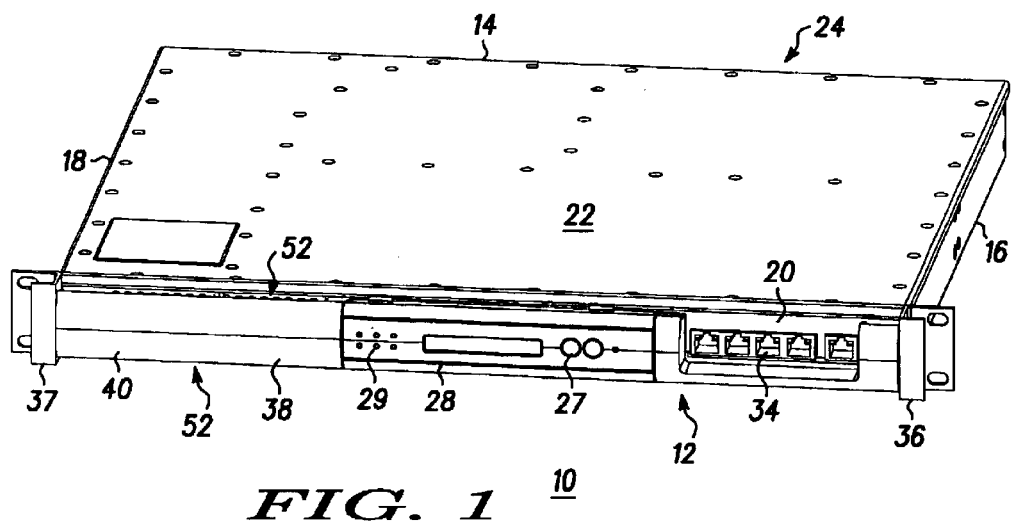
FIG. 1 is a front perspective view of the chassis of the present invention with the front panel and display module in place.
Figure 2:
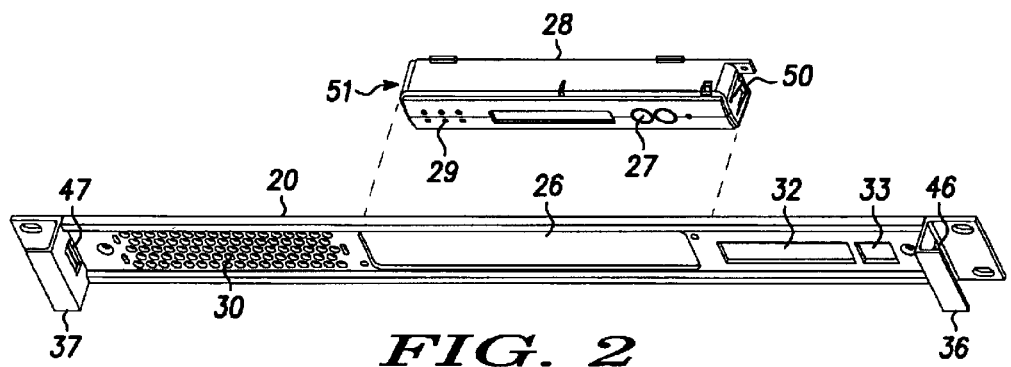
FIG. 2 is a perspective view of the front panel and display module portions detached from the chassis and each other.

FIGS. 1 and 3 through 5 show a chassis 10 for a single "rack-unit" which is commonly referred to as a 1RU cable modem termination system (CMTS). Under current industry standard a "rack-unit" equals approximately 1.75 inches, 2RU equals approximately 3.5 inches and etcetera. As seen best in FIGS. 1 and 4, the chassis 10 includes a base 12 having a rear 14, left 16 and right 18 side walls, a front panel 20, and a top 22, combined to form the base enclosure or housing 24. As shown in FIG. 2, the front panel 20 includes a display module slot 26, an air inlet vent 30 and jack slots 32, 33. In this embodiment, the front panel 20 includes left and right handles, 36 and 37 respectively, to aid the user with inserting and removing the chassis 10 from an industry standard communications infrastructure equipment rack (not shown). A display module 28 is detachably secured to the front panel 20 to house a module such as an LCD, and functional switches 27, such scroll, enter select, abort and mode selection, and displays 29, such as LEDs for indicating status or warning signals (thermal conditions or power) for various modules and functions within the chassis.

Figure 3:
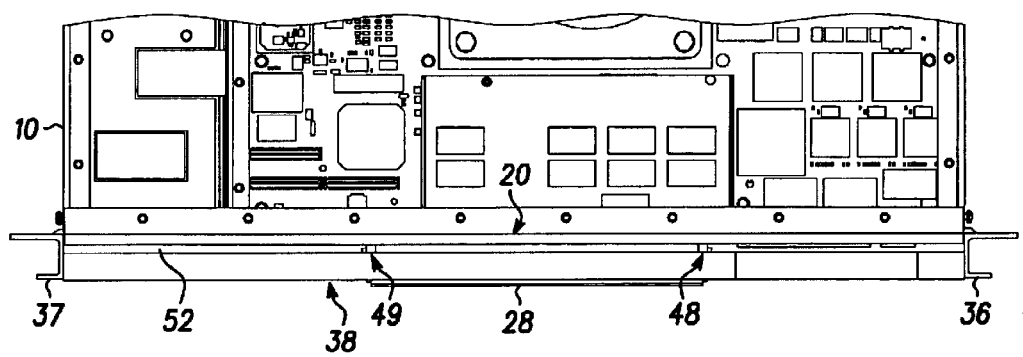
FIG. 3 is a partial top view of the front portion of the chassis with the front panel and display module attached and the top panel removed, showing the internal circuitry and the air intake slot.
Figure 4:
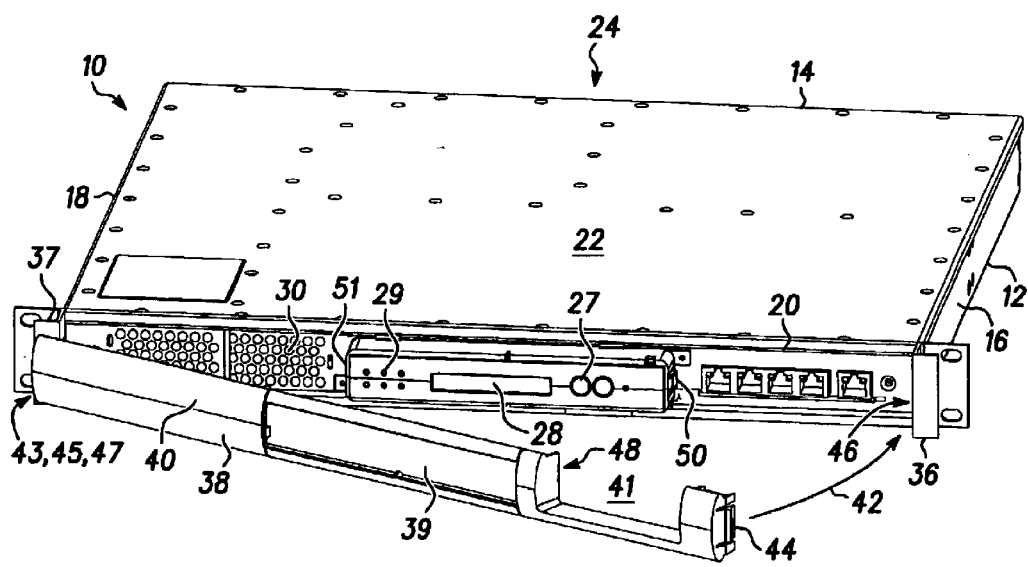
FIG. 4 is a front perspective view of the chassis with the front panel partially installed.

As shown in FIG. 4, the preferred face bar 38 is detachable from the front panel 20 to ease access for service and cleaning. The face bar 38 may display a logo on the billboard surface 40. The face bar 38 includes a slot 39 for the display module 28 and cut out 41 around jack slots 32 and 33. The face bar 38 also serves to cover and conceal the air inlet vent 30. In this embodiment, the face bar 38 is removably secured to the front panel 20 by outwardly biased exterior tabs, 44 and 45, which engage behind a respective handle 36 or 37. The face bar 38 is additionally secured by mounting clips, 48 and 49 which mate to the display module with a respective tab, 50 or 51. As best shown in FIGS. 1 and 3, an air intake slot 52 is formed by spacing the face bar 38 when it is secured to the front panel 20. The air intake slot 52 permits air from above and below the face bar 38 ingress into the air inlet vent 30 (see FIG. 4). The design of the face bar 38 accommodates the preferred functional requirements for the front of the chassis 10 while maintaining an attractive appearance.

Figure 5:
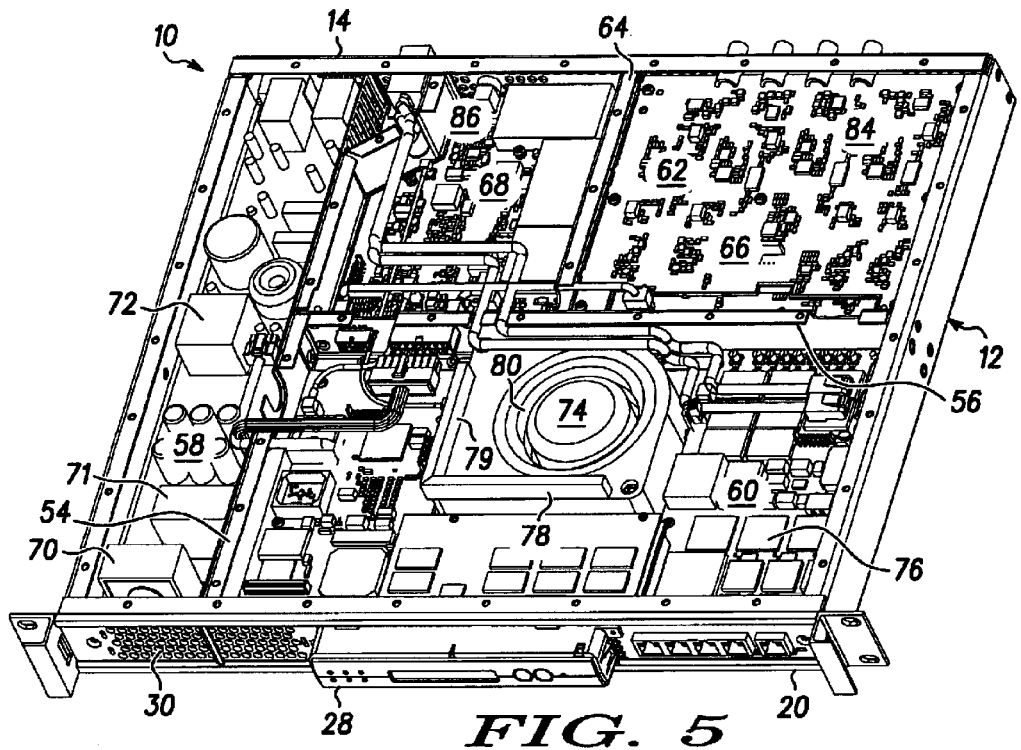
FIG. 5 is a top perspective view of the chassis without the front and top panels, but with the display module, showing the internal components and centrifugal blower.
Figure 6:
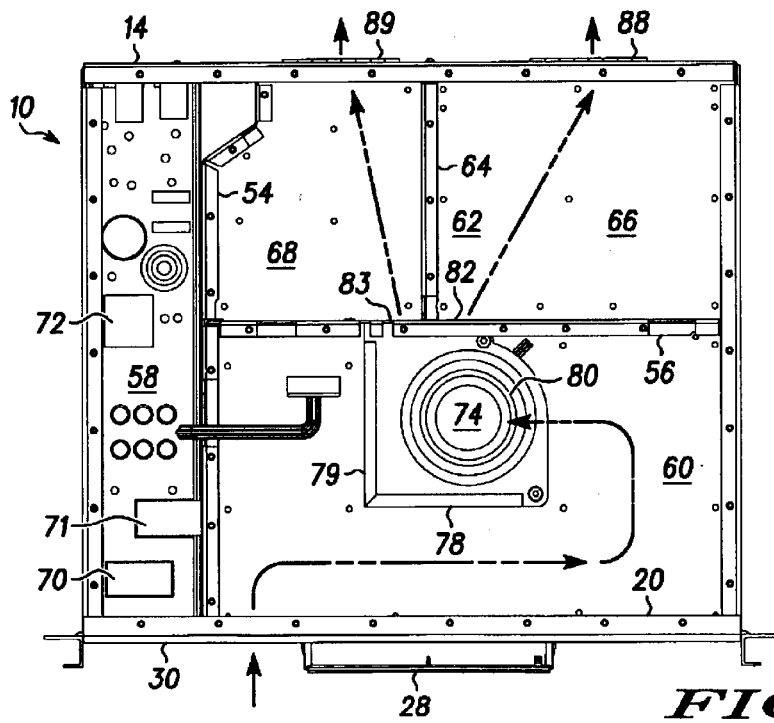
FIG. 6 is a top plain view of the chassis illustrating the internal air flow through the chassis.
Figure 7:
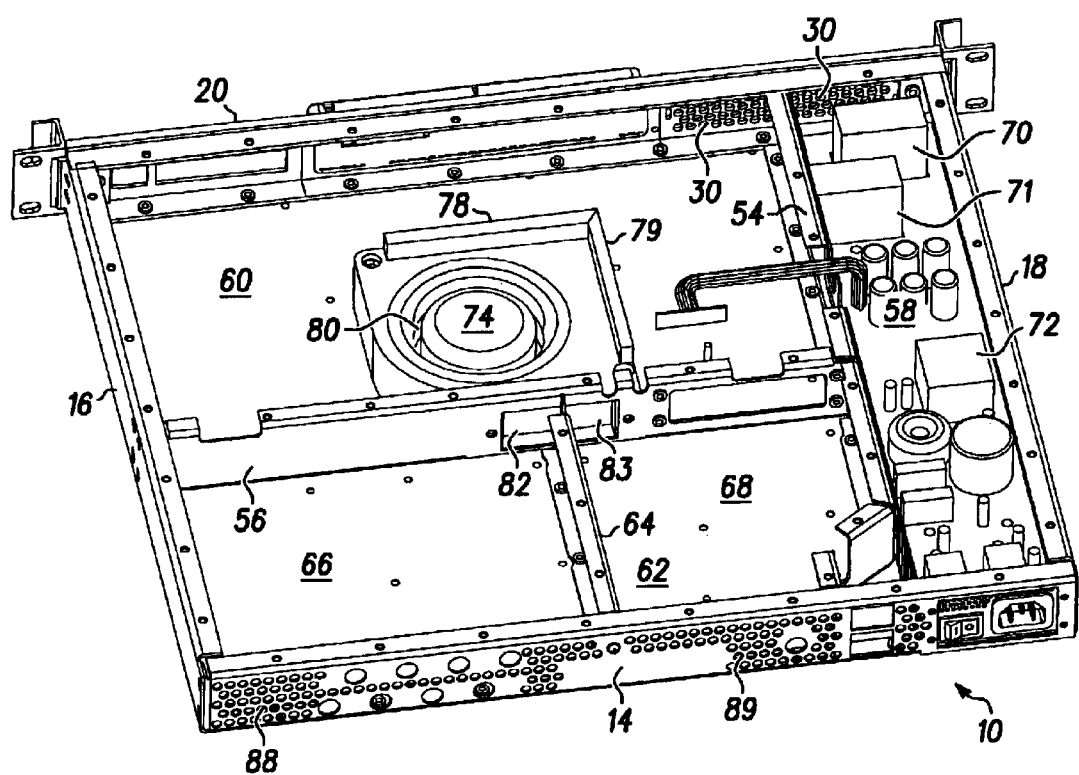
FIG. 7 is a rear perspective view of the chassis illustrating the exhaust ports and vents.

FIGS. 5 through 7 show an internal view of the chassis 10 with the face bar 38 and top plate 22 removed. As best shown in FIG. 6, the chassis 10 is preferably divided into three (3) internal chambers, 58, 60, and 62, by an intake dividing wall 54 and a central dividing wall 56. In this embodiment, the chambers include a power supply circuitry chamber 58, a digital printed wiring assembly (PWA) chamber 60, and a radio frequency ("RF") PWA chamber 62. The RF PWA chamber 62 may be further divided by an exhaust dividing wall 64 into a receiving PWA chamber 66 and a transmitting PWA chamber 68. The RF PWA chamber 62 may be divided into additional chambers by the use of exhaust dividing walls.

As best shown in FIG. 6, the intake air flowing into the air inlet vent 30 initially enters the power supply circuitry chamber 58 and the digital PWA chamber 60. One or more axial fans 70, 71 secured to the base plate 12 and located within the power supply circuitry chamber 58, sweep air from the front of the chamber 58 to the rear of the chamber 58 to cool the internal circuitry of the chamber 58, including power supply circuitry 72. One example of an axial fan is the Panasonic model 4Bko4f.

As shown in FIG. 6, the path of air entering the digital PWA chamber 60 is influenced by the centrifugal blower 74. The centrifugal blower 74 is centrally located within the digital PWA chamber 60 with its blower facing up. One acceptable blower is available from Comair Rotron as model BD12B7, also known as Biscuit (r) DC. This unit occupies a footprint of no more than 4.75 inches squared and has a height or thickness of 1.25 inches. A digital PWA 76 (see FIG. 5) is located within the digital PWA chamber 60. The digital PWA 76 is the most temperature sensitive component within the chassis 10, and accordingly requires a sufficient flow of air to maintain its operating temperature. One or more baffles 78, 79, may be secured to the top plate 22 to direct air flowing through the digital PWA chamber 60 over as much of the circuitry as possible. In this embodiment, the baffles are made of foam and are carried by the top plate 22. By placing the baffles 78, 79 in an L-shape, the centrifugal blower 74 pulls the intake air in a non-linear path through the circuitry within the digital PWA chamber 60. Of course, the baffles 78, 79 may be placed in the required configuration for the desired airflow to cool each particular circuit design.

The centrifugal blower 74 pulls the intake air into its intake port 80. The blower intake port 80 faces upward to move the hotter air outwardly through the blower exhaust ports 82, 83 and into the RF PWA chamber 62 (see FIG. 7). Air exiting the centrifugal blower 74 is forced into the RF PWA chamber 62 at a high velocity to cool receiving PWA 84 and transmitting PWA 86 (see FIG. 5). Air exiting the centrifugal blower 74 may be separately directed by wall 64 into the receiving PWA chamber 66 and transmitting PWA chamber 68 (see FIG. 7). The exhaust dividing wall 64 may also be located to direct a higher volume of air to either the receiving PWA chamber 66 or transmitting PWA chamber 68. The final air egress from the RF PWA chamber 62 is through one or more exhaust vents 88, 89 located on the rear wall 14 (see FIG. 7). The use of a dividing wall 64 and multiple ports on the exhaust side of the blower 74 allows the cooling system of the present invention to effectively cool many different components of the internal circuitry.

While principles of the invention have been described above in connection with the specific apparatus, it is to be clearly understood that this description is made only by way of example and not as a limitation on the scope of the invention.

What we claim is:

1. An electronic chassis and housing having an integrated force air cooling system, comprising:
    a) a housing having a top, a base and front, back, left and right side walls which define an interior space having a predetermined height, as measured between the top and the base, and an inlet vent in at least one side wall and an exhaust vent in an opposed side wall;
    b) a centrifugal blower assembly having defined top and bottom planes and perimeter walls; a second predetermined height measured between the top and bottom planes that is less than the predetermined height of the interior space; and inlet and outlet ports; the blower assembly is mounted within the interior space such that its inlet port is in fluid communication with the inlet vent and its exhaust port is in fluid communication with the exhaust vent; and,
    c) a baffle, positioned within the interior space so that it directs the flow of air from the inlet vent through a horizontally non-linear path to the blower inlet port, wherein the baffle is comprised of at least one blower assembly side wall that extends upwardly beyond the top plane and contacts the top of the housing.

2. The invention of claim 1, wherein the baffle is positioned between the housing inlet vent and said blower inlet port.

3. The invention of claim 1, wherein the baffle is comprised of foam gasket material.

4. The invention of claim 1, wherein the blower is centrally located within the interior space and includes a fan having a diameter greater than the predetermined height.

5. The invention of claim 4, wherein the inlet vent is located in one side wall of the housing, the blower inlet port is directed toward another side wall of the housing and the baffle directs air past the blower assembly before it enters the blower inlet port.

6. The invention of claim 1 further comprising:
    d) at least one interior wall dividing the interior space into first and second chambers with the centrifugal blower being in one chamber and both chambers being in fluid communication with the inlet and exhaust vents.

7. The invention of claim 6 further comprising:
    e) an axial fan located in other chamber with an inlet port in fluid communication with the inlet vent and an outlet port in fluid communication with the outlet vent.

8. A chassis for housing printed circuit boards comprising:
    a) a housing having a top, bottom, front, back, left and right side walls, and a height, measured from the bottom wall to the top wall, that is equal to a 1 rack-unit, said front wall including an inlet vent, a display module, and a jack; and,
    b) a face plate including a bill board surface, display module slot, and a jack slot, arranged to overlay said inlet vent, display module and jack, respectively,
    wherein said bill board portion and said vent define parallel, spaced apart planes so that said vent is concealed from view, but in fluid communication with the exterior ambient atmosphere.

9. The chassis recited in claim 8, wherein said front wall includes a plurality of jack, and a pair of installation handles.

10. The chassis recited in claim 8, wherein said bill board surface includes identifying indicia thereon.

11. A face plate for a printed circuit board chassis having a top, bottom, front, back, left and right side walls, a height, measured from the bottom wall to the top wall, which is equal to a 1 rack-unit, said front wall including an inlet vent, a display module, and a jack, said face plate comprising:

a) a planar logo surface portion arranged to overlay the inlet vent in a parallel, overlapping but offset plane so that said vent is concealed from view from, but is in fluid communication with, the front exterior of said chassis;

b) a display module slot arranged to overlay the display module; and, c) a jack slot arranged to overlay the jack.

12. A chassis for housing printed circuit boards comprising:

a) a housing having a top, bottom, front, back, left and right side walls, and having a height, measured from the bottom wall to the top wall, that is equal to a 1 rack-unit, said front wall including an inlet vent, a display module, and a jack;

b) an exhaust vent in said back side wall;

c) a centrifugal blower inside said chassis housing, said blower having a housing with top, bottom, and side walls, an inlet port in fluid communication with said inlet vent, and an exhaust port in fluid communication with said exhaust vent, said blower housing having a height, measured from the bottom wall to the top wall, that is less than the height of said chassis housing;

d) a partition intermediate said housing inlet vent and said blower inlet port, said partition diverting the flow of air along an indirect path within the housing from said inlet vent to said blower inlet port;

e) a front wall face plate including a planar logo surface portion, display module slot, and a jack slot, arranged to overlay said inlet vent, display module and jack, respectively;

wherein said logo surface portion and said inlet vent are arranged in parallel, overlapping but offset planes so that said vent is concealed from view, but is in fluid communication with, the front exterior of said chassis.

13. The chassis recited in claim 12 including:

f) a chassis housing interior wall dividing the interior into a first chamber in which the centrifugal blower is located and second chamber, both chambers being in fluid communication with said inlet vent and said exhaust vent; and, g) an axial fan located in said second chamber, said axial fan having an inlet port in fluid communication with said inlet vent and an outlet port in fluid communication with said outlet vent.

14. The chassis recited in claim 12, wherein said front wall includes a plurality of jacks, and a pair of installation handles.

15. The chassis recited in claim 12, wherein said logo surface includes identifying indicia printed or embossed thereon.

16. A printed circuit board chassis for insertion in a standard communications infrastructure equipment rack, the chassis comprising:

a) a housing having a top, bottom, front, back, left and right side walls, and having a height, measured from the bottom wall to the top wall, that is equal to a 1 rack-unit of approximately 1.75 inches, said front wall including an inlet vent, a display module, and a jack;

b) an exhaust vent in said back side wall;

c) a centrifugal blower inside said chassis housing, said blower having a housing with top, bottom, and side walls, an inlet port in fluid communication with said inlet vent, and an exhaust port in fluid communication with said exhaust vent, said blower housing having a height, measured from the bottom wall to the top wall, that is less than 1.75 inches;

d) a partition intermediate said housing inlet vent and said blower inlet port, said partition diverting the flow of air along an indirect path within the housing from said inlet vent to said blower inlet port; and e) a front wall face plate including a planar logo surface portion, display module slot, and a jack slot, arranged to overlay said inlet vent, display module and jack, respectively.

17. The chassis of claim 16 wherein said logo surface portion and said inlet vent are arranged in parallel, overlapping but offset planes so that said vent is concealed from view, but is in fluid communication with, the front exterior of said chassis.

18. The chassis of claim 16 wherein said front wall includes a pair of installation handles.

* * * * *